(12) United States Patent
Tsuchiya

(10) Patent No.: US 7,512,923 B2
(45) Date of Patent: Mar. 31, 2009

(54) AUTOMATIC ESTIMATION METHOD, APPARATUS, AND RECORDING MEDIUM

(75) Inventor: Atsushi Tsuchiya, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 117 days.

(21) Appl. No.: 11/538,851

(22) Filed: Oct. 5, 2006

(65) Prior Publication Data
US 2007/0220465 A1    Sep. 20, 2007

(30) Foreign Application Priority Data
Mar. 15, 2006 (JP) .............................. 2006-070815

(51) Int. Cl.
*G06F 17/50* (2006.01)
(52) U.S. Cl. .................... 716/11; 716/6; 716/9; 716/12
(58) Field of Classification Search .................... 716/6, 716/9, 11, 12
See application file for complete search history.

(56) References Cited
U.S. PATENT DOCUMENTS
6,865,726 B1 *   3/2005   Igusa et al. .................... 716/18

FOREIGN PATENT DOCUMENTS
JP    2001-267429    9/2001

* cited by examiner

*Primary Examiner*—Thuan Do
(74) *Attorney, Agent, or Firm*—Fujitsu Patent Center

(57) ABSTRACT

Data for automatic layout processing is obtained, a plurality of values used for the estimation of an estimated value to be assigned for the automatic layout processing is prepared from the obtained data, and estimation of the estimated value is automatically performed using the prepared plurality of values. The estimation is performed by, for example, preparing in advance a table in which a plurality of estimated values are defined, and extracting from the table an estimated value specified from the prepared plurality of values. By automatic estimation of the estimated value in such a manner, a designer can easily and quickly assign an estimated value.

13 Claims, 14 Drawing Sheets

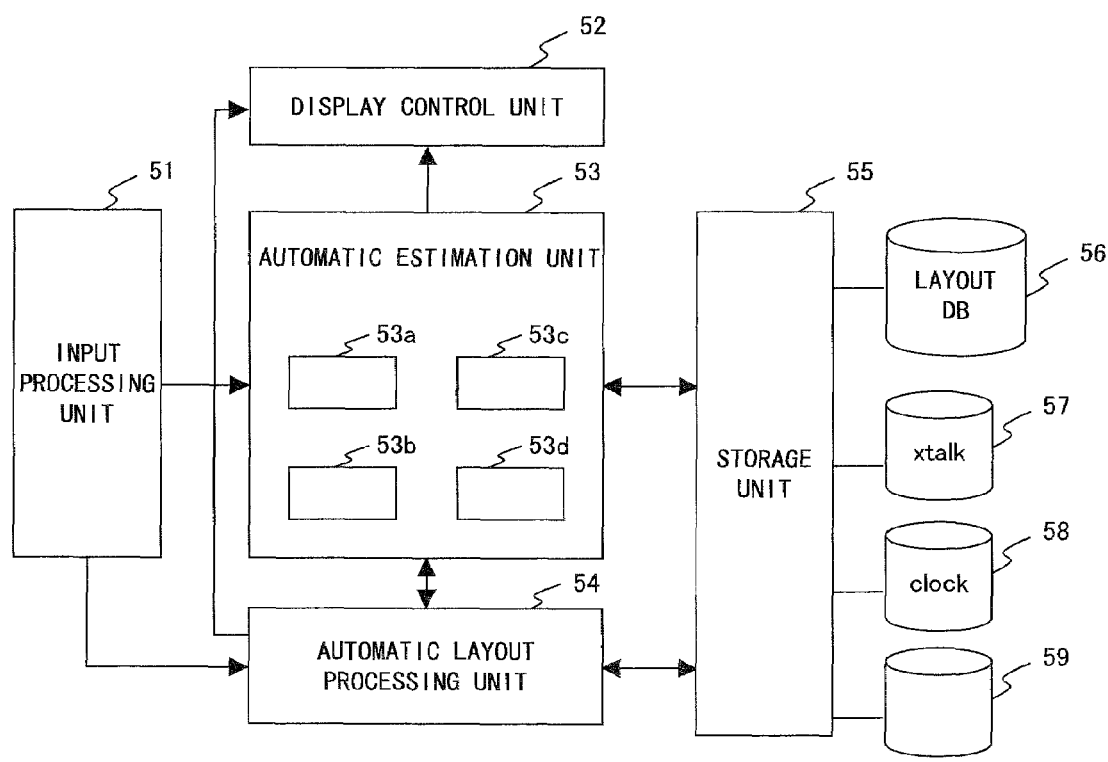
F I G. 5

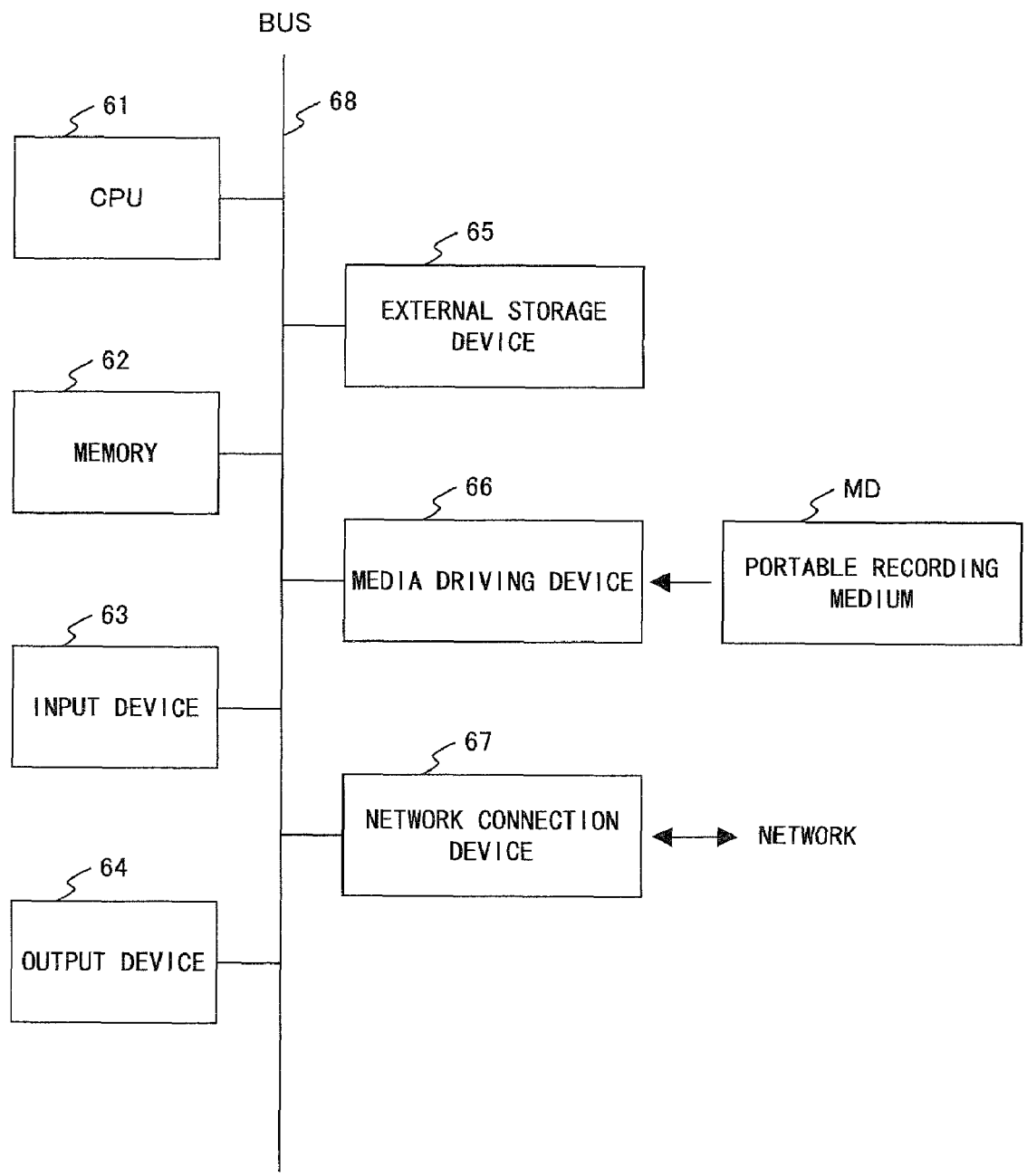
F I G. 6

THREE-DIMENSIONAL TABLE 57a

CONGESTION DEGREE OF AREA WHERE NET IS PRESENT : 10

| NET WIRE ROUTE LENGTH \ CELL DRIVING FORCE | 1 | 50 | 100 |
|---|---|---|---|
| 1 | 4 | 2 | 1 |
| 5 | 18 | 6 | 3 |
| 10 | 32 | 20 | 12 |

CONGESTION DEGREE OF AREA WHERE NET IS PRESENT : 20

| NET WIRE ROUTE LENGTH \ CELL DRIVING FORCE | 1 | 50 | 100 |
|---|---|---|---|
| 1 | 34 | 27 | 22 |
| 5 | 47 | 37 | 25 |
| 10 | 65 | 41 | 32 |

CONGESTION DEGREE OF AREA WHERE NET IS PRESENT : 30

| NET WIRE ROUTE LENGTH \ CELL DRIVING FORCE | 1 | 10 | 50 | 100 |
|---|---|---|---|---|
| 1 | 52 | 50 | 46 | 37 |
| 5 | 78 | 69 | 52 |  |
| 10 | 103 | 80 | 67 |  |
| ... | ... | ... | ... | ... |

Xtalk DELAY OF THE FOLLOWING NET IS 80ps.
NET WIRE ROUTE LENGTH : 10
CELL DRIVING FORCE : 50
CONGESTION DEGREE OF AREA WHERE NET IS PRESENT : 30

(NOTE) VALUE MISSING FROM TABLE IS CALCULATED BY INTERPOLATION

F I G. 1 1

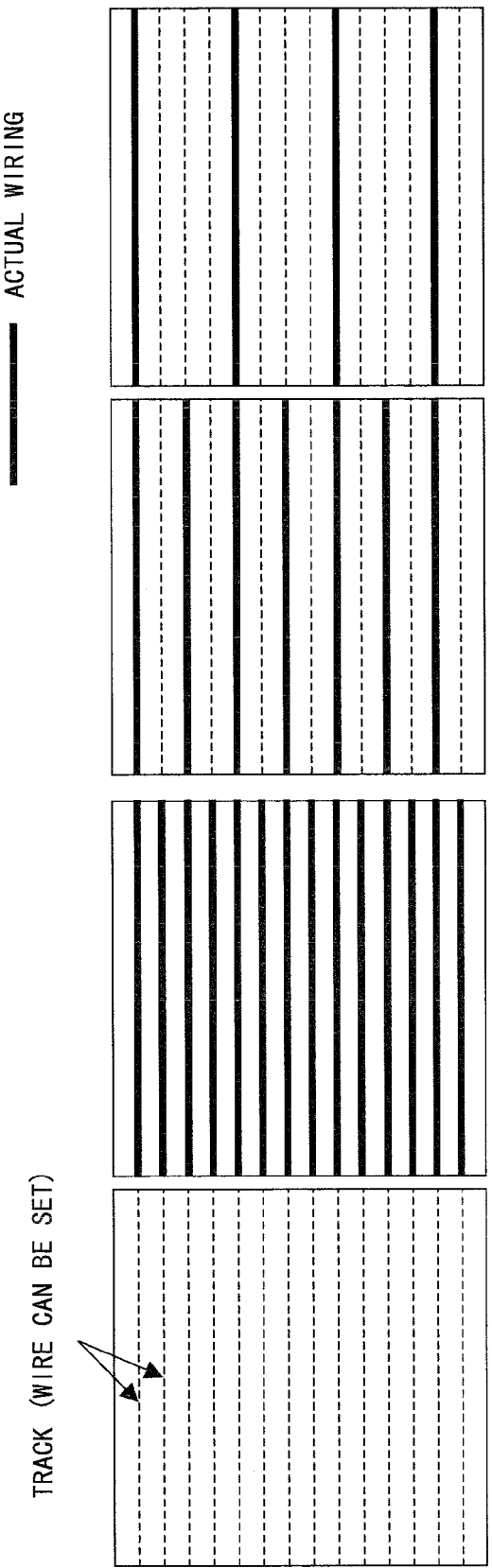

FIG. 14

MAX. GATING STAGE NUMBER: 1

| LEAF NUMBER | AREA WHERE ALL LEAVES ARE PRESENT | | | |
|---|---|---|---|---|
| | 10 | 50 | 100 | ... |
| 1000 | 300/10 | 1300/100 | 1800/200 | ... |
| 5000 | 400/50 | 1400/150 | 1900/250 | ... |
| 10000 | 500/100 | 1500/200 | 2000/300 | ... |

MAX. GATING STAGE NUMBER: 2

| LEAF NUMBER | AREA WHERE ALL LEAVES ARE PRESENT | | | |
|---|---|---|---|---|
| | 10 | 50 | 100 | ... |
| 1000 | 800/200 | 1800/300 | 2800/400 | ... |
| 5000 | 900/250 | 1900/350 | 2900/450 | ... |
| 10000 | 1000/300 | 2000/400 | 3000/500 | ... |

MAX. GATING STAGE NUMBER: 3

| LEAF NUMBER | AREA WHERE ALL LEAVES ARE PRESENT | | | |
|---|---|---|---|---|
| | 10 | 50 | 100 | ... |
| 1000 | 2600/200 | 3600/400 | 4600/600 | ... |
| 5000 | 2800/300 | 3800/500 | 4800/700 | ... |
| 10000 | 3000/400 | 4000/600 | 5000/800 | ... |

CLOCK DELAY / CLOCK SKEW

THREE-DIMENSIONAL TABLE 58

THE FOLLOWING CLOCK ROUTE HAS CLOCK DELAY OF 4000ps AND CLOCK SKEW OF 600ps.
LEAF NUMBER : 10000
AREA WHERE ALL LEAVES ARE PRESENT : 50
MAX. GATING STAGE NUMBER : 3

(NOTE) VALUE MISSING FROM TABLE IS CALCULATED BY INTERPOLATION

AUTOMATIC ESTIMATION METHOD, APPARATUS, AND RECORDING MEDIUM

CROSS REFERENCE TO RELATED APPLICATIONS

This application is based upon and claims the benefit of priority from the prior Japanese Patent Application No. 2006-070815 filed on Mar. 15, 2006, the entire contents of which are incorporated herein by reference.

BACKGROUND OF THE INVENTION

1. Field of the Invention

The present invention relates to a technology for automatically estimating a value to be assigned for automatic layout processing, which determines the arrangement of cells and the arrangement of the wiring connecting the cells constituting a logically designed electronic circuit.

2. Description of the Related Art

At present, electronic circuits are, in general, designed using CAD. In CAD, elements or components that will be functional or logical units of an electronic circuit are registered as basic elements (cells) in a library. Therefore, logical design is basically performed by selecting the necessary cells registered in the library and connecting the selected cells. Connection of the cells can be achieved by connecting pins contained in each cell.

The result of the logical design is converted into a net list (logical circuit data). The net list is written as an interconnection of the cells registered in the library. By using the net list, automatic layout processing is performed, and verification is performed after completion of the processing.

FIG. 1 is a diagram showing the flow of the automatic layout processing.

In the automatic layout processing, as shown in FIG. 1, each of the following steps is performed as a design phase in the following order: determination of cell arrangement (step S1); estimation of the delay of the electronic circuit and timing optimization in order to ensure that the delay is within a range required for normal operation of the circuit (step S2); clock tree synthesis (CTS) (step S3); timing optimization after CTS (step S4); wire routing (step S5); and timing optimization after the routing (step S6). If a point to be improved is found as a result of the timing optimizations in steps S2, S4, or S6, the operation returns to the design phase prior to the point needing improvement, and the designing in the phase is performed once again. By doing this, verification (sign-off) is conducted on electronic circuits after an operation check by the automatic layout processing. The "preCTS", "postCTS", and "postRoute" shown in FIG. 1 denote the design phase performed before CTS, the design phase performed after CTS, and the design phase after wire routing, respectively.

The timing optimization in step S2 is the design phase performed before CTS (preCTS). Since CTS has not been performed, the route between the cell (clock root) 21 that will be the synthesis root of the clock and the cell at which the clock ultimately will arrive (synch cell) is yet unknown in the design phase, as shown in FIG. 2. For that reason, the clock delay and the clock skew, which is the lag in the arrival time of the clock, are also unknown.

Currently, crosstalk (Xtalk) noise has been increasing due to the miniaturization of wiring lines, which influences signal delay. In the timing optimization in step S4, since it is before wire routing being performed, coupling capacity generated between adjacent wires cannot be calculated. As shown in FIG. 3, after wire routing, since wiring routes are determined, the coupling capacity present between the wire connecting cell 31 and cell 32 and the wire connecting cell 35 and cell 36, and the coupling capacity present between the wire connecting cell 32 and cell 33 and the wire connecting cell 37 and cell 38 can be calculated. However, those coupling capacities cannot be calculated before the wire routing.

As described above, in an automatic layout tool, which is application software for automatic layout processing, a designer has to manually assign (set) an estimated value for the clock skew, Xtalk delay for preCTS, and Xtalk delay for postCTS, as shown in FIG. 4. It is desirable that those estimated values (timing margins) are close to the actual values. This is because a value estimated on the basis of a harsher perspective than the actual value makes the design more difficult than necessary, and a value estimated based on a more lenient perspective than the accrual value is likely to cause iteration, i.e., performance of the previous design once again.

The current condition is such that even a designer with high skill has to conduct troublesome operations in order to assign a necessary estimated value with such automatic layout processing. Thus, it is considered to be important for a designer to be able to easily assign proper estimated values.

SUMMARY OF THE INVENTION

It is an objective of the present invention to provide a technology whereby a designer can easily assign an estimated value necessary for automatic layout processing.

Both the first and second modes of the automatic estimation method of the present invention are methods for automatically estimating an estimated value to be assigned for automatic layout processing determining arrangement of cells constituting a logic-designed electronic circuit and a wiring line connected between the cells, and both perform automatic estimation of estimated values as described below.

The first mode of the automatic estimation method prepares in advance a table defining a plurality of the estimated values, causes one or more of the reference values for the reference of the estimated value defined in the table to be prepared by obtaining data for the automatic layout processing, and causes a value specified from the prepared reference value from the table to be extracted and automatically estimated.

The second mode of the automatic estimation method obtains data for the automatic layout processing, prepares a plurality of values used for estimation of the estimated value from the obtained data, and causes the estimation of the estimated value to be automatically performed using the prepared plurality of values.

The automatic estimation apparatus according to the present invention, which automatically estimates an estimated value to be assigned for automatic layout processing determining arrangement of cells constituting a logic-designed electronic circuit and a wiring line connected between the cells, comprises table obtaining means for obtaining a table defining a plurality of the estimated values, data obtaining means for obtaining data for the automatic layout processing, and estimation means for performing one or more of the following: the preparation of a reference value for reference of the estimated value defined in the table from the data obtained in the data obtaining means, the extraction of an estimated value specified from the prepared reference value from the table, and the automatic performance of estimation.

The recording medium according to the present invention is accessible by a computer, which can be used as an automatic estimation apparatus that automatically estimates an estimated value to be assigned for automatic layout processing determining arrangement of cells constituting a logic-designed electronic circuit and a wiring line connected between the cells, and records a program realizing a table obtaining function for obtaining a table defining a plurality of the estimated values, a data obtaining function for obtaining data for the automatic layout processing, and an estimation function for performing one or more of the following: preparation of a reference value for reference of the estimated value defined in the table from the data obtained in the data obtaining function, extracting an estimated value specified from the prepared reference value form the table, and automatically performing estimation.

In the present invention, data for automatic layout processing is obtained, a plurality of values used for estimation of the value to be assigned for the automatic layout processing are prepared from the obtained data, and estimation of the estimated value is automatically performed using the prepared plurality of values. The estimation is performed by, for example, preparing in advance a table in which a plurality of estimated values are defined, and extracting from the table an estimated value specified from the prepared plurality of values. By automatic estimation of the estimated value in such a manner, a designer can easily and quickly assign the estimated value.

Iteration, which is to perform once again the design (processing) of a design phase performed in the past, occurs more than once in general. The chances of large-scale changes occurring due to the iteration are relatively small. For that reason, it is possible to obtain further appropriate estimated values by newly preparing a table defining any of the determined values and a value obtained from the determined value if a determined value corresponding to the estimated value is obtained by execution of automatic layout processing.

BRIEF DESCRIPTION OF THE DRAWINGS

FIG. 5 is a diagram showing the configuration of an automatic layout processing apparatus loading an automatic estimation apparatus according to the present embodiment;

FIG. 6 is a diagram showing the hardware configuration of a computer, which can be used as an automatic estimation apparatus according to the present embodiment;

FIG. 11 is a diagram showing the configuration of the Xtalk table;

FIG. 13A is a diagram showing an example of the track resource;

FIGS. 13B-13D are diagrams showing the difference in the degree of congestion according to actual wiring lines in the example of the track resource shown in FIG. 13A; and FIG. 14 is a diagram showing the configuration of the clock table.

DESCRIPTION OF THE PREFERRED EMBODIMENTS

Figure 1:
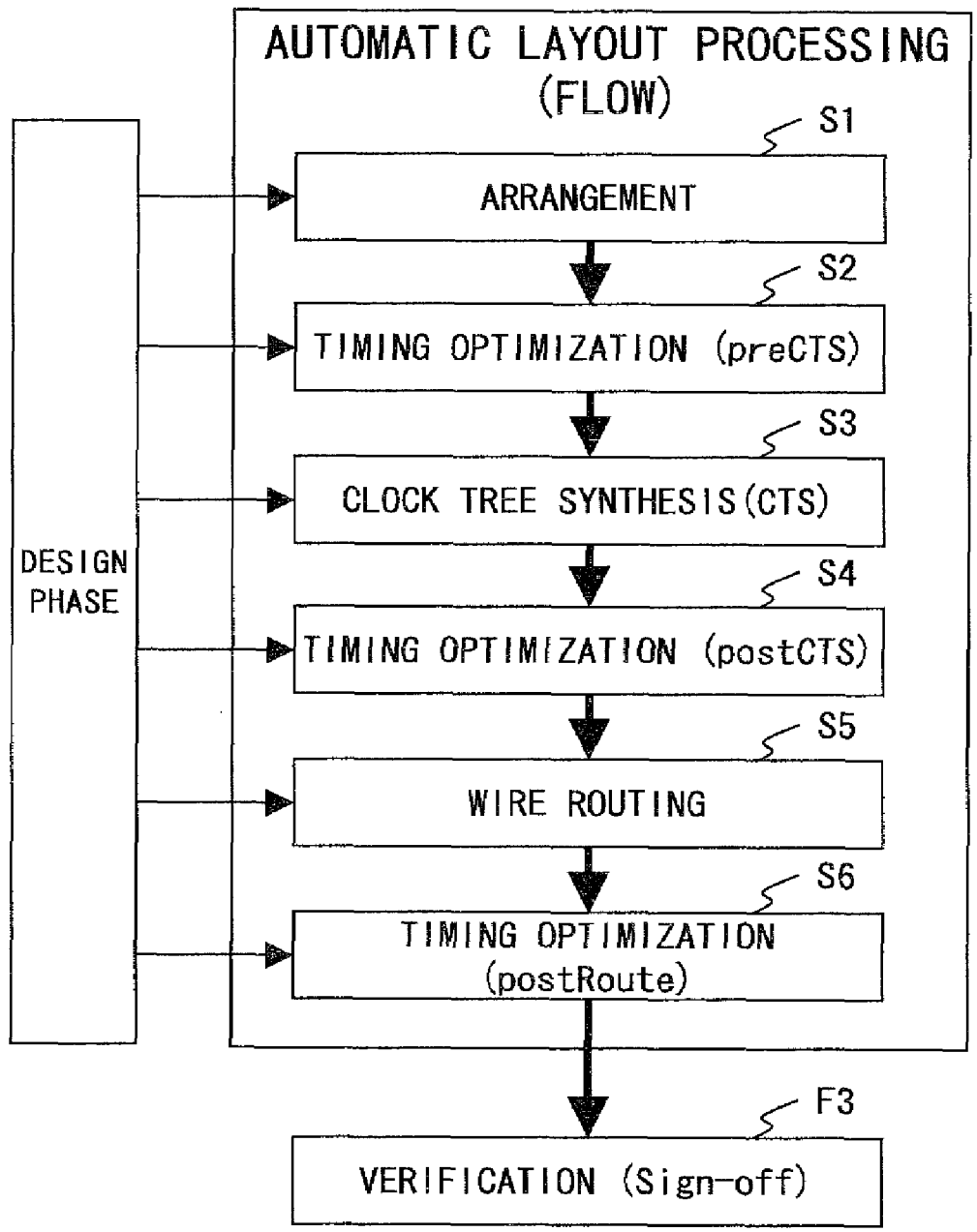
FIG. 1 is a diagram showing the flow of the automatic layout processing.

In the following description, details of the embodiments of the present invention are set forth with reference to the drawings.

FIG. 5 is a diagram showing the configuration of an automatic layout processing apparatus loading an automatic estimation apparatus according to the present embodiment.

The layout processing apparatus, as described in FIG. 5, has a configuration comprising an input processing unit 51 for data input by a designer (a user), a display control unit 52 for displaying information to be displayed on a display device, an automatic estimation unit 53 for automatically estimating an estimated value required for execution of the automatic layout processing, an automatic layout processing unit 54 for executing the automatic layout processing, and a storage unit 55, which can store various data.

The storage unit 55 stores a layout database (DB) 56, a Xtalk table 57 for Xtalk delay estimation, a clock table 58 for clock delay and clock skew estimation, and a table 59 for the second or later estimation of the clock delay and the clock skew. The layout DB 56 is used in a common automatic layout tool and stores information such as arrangement information indicating cell arrangement, connection information indicating connection relationships between cells, and driving force information indicating the driving force (resistance value) of cells. The stored contents are updated on an as-needed basis by the execution of the automatic layout processing unit 54. The automatic layout processing unit 54 executes the automatic layout processing shown in FIG. 1 in accordance with instructions from the designer via the input processing unit 51.

Figure 4:
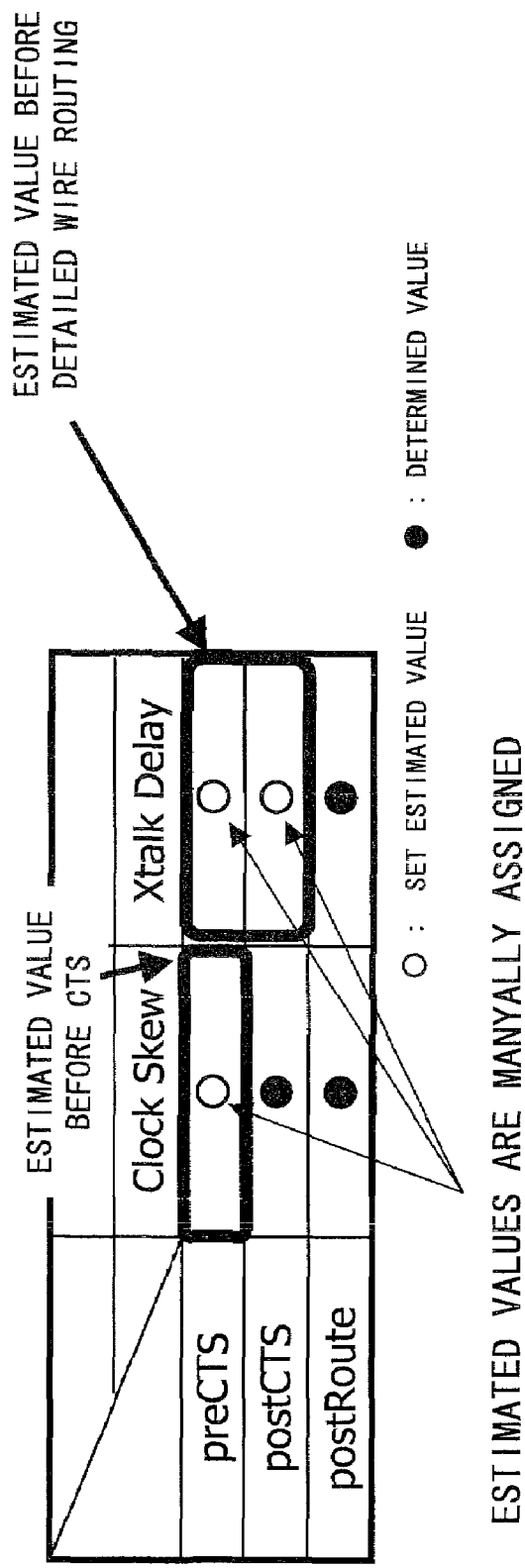
FIG. 4 is a diagram showing the estimated valued, which needs to be assigned, for each of the design phases.

The execution of the automatic layout processing requires, as shown in FIG. 4, each of the estimated values of the clock skew and that of the Xtalk delay for preCTS, and the estimated value of the Xtalk delay for postCTS. The automatic estimation unit 53 automatically estimates those estimated values, and provides them to the automatic layout processing unit 54. The Xtalk table 57, the clock table 58, and the table 59 are used for the estimation of those estimated values.

FIG. 6 is a diagram showing the hardware configuration of a computer that can be used as the above automatic layout processing apparatus. Before the detailed explanation of FIG. 5, details are given on the configuration of the computer that can be used as an automatic layout processing apparatus.

The computer shown in FIG. 6 has a configuration comprising a CPU 61, memory 62, an input device 63, an output device 64, an external storage device 65, a media driving device 66, and a network connection device 67, and these are connected to each other by a bus 68. The configuration shown in FIG. 6 is merely an example and does not limit the present invention.

The CPU 61 controls the entire computer. The memory 62 is memory such as RAM that temporarily stores programs or data stored in the external storage device 65 (or portable storage medium MD) in program execution or data update etc. CPU 61 performs control by reading out a program to the memory 62 and executing the program.

The input device 63 is connectable to an external input device such as a keyboard or a mouse, or has such an external input device, for example. After detecting user operations to the external input device, the CPU 61 is notified of the detection result.

The output device 64 is connectable to a display, for example, or has a display. The data transmitted by the control of the CPU 61 is output on the display.

The network connection device 67 is a device for communicating with other devices via a communication network such as a LAN or the Internet. The external storage device 65 could be a hard disk device, for example. It is mainly used for storage of various data and programs.

The medium driving device 66 is a device for accessing a portable storage medium MD such as an optical disk and a magnetic optical disk.

The automatic layout processing apparatus shown in FIG. 5 is realized, for example, by the CPU 61 reading a program stored in the external storage device 65 to the memory 62 and executing the program. The program may be a program that the network connection device 67 obtained via a communication network, or a program that the medium driving device 66 read out from the storage medium MD.

FIG. 11 is a diagram showing the configuration of the Xtalk table. With reference to FIG. 11, details of an estimation method of the Xtalk delay value by the above automatic estimation unit 53 are explained.

The Xtalk delay is caused by Xtalk noise. The intensity of the noise depends on the coupling capacity. The capacity increases the distance between wires becomes shorter, and as the section of the wires for which the distance between is short becomes longer. As the total line length of the wiring becomes longer, the wiring connecting between cells (net wiring line) becomes closer. The degree of influence of the Xtalk noise varies depending on the signal with which the noise overlaps. For that reason, in the present embodiment, as shown in FIG. 11, a three-dimensional table defining the Xtalk delay value for every combination of a congestion degree of area, cell driving force, and a net wiring line length, is employed as Xtalk table 57. FIG. 11 represents the value by a set of a plurality of two-dimensional tables separated by the congestion degree.

The congestion degree of area is an index that divides the whole substrate, on which an electronic circuit is constructed, into a plurality of areas, and represents the degree of wire routing in a track resource where wiring is allowed for each area. In cases in which the track resource is present as indicated by the dotted lines in FIG. 13A, when the wiring is present as shown by the solid lines in FIGS. 13B-13D, the congestion degrees of are evaluated as 100, 50, and 25, respectively. Accordingly, the congestion degree of area is employed as an index representing the distance between net wiring lines, that is, the measure of the coupling capacity. The net wiring line length is also employed as an index representing the measure of the coupling capacity for each net wiring line. The cell driving force is the driving force of a clock source (hereinafter referred to as "driving cell"). It is employed as an index representing the degree of influence of the Xtalk noise.

Xtalk table 57 defines the Xtalk delay value for each combination of those indices. By doing this, the defined delay values should be an estimate on the ground of the contents to be considered for estimation of the delay value by a designer with high skills. Hence a designer, regardless of his/her skill level, can quickly assign a reasonable Xtalk delay value at any time. The estimate of the Xtalk delay value is automatically performed by a first estimation unit 53a.

Xtalk table 57 suitable for the electronic circuit to be designed cannot be prepared in advance. However, once the design progresses to postRoute (step S6 of FIG. 1), it is possible to generate a Xtalk table 57 suitable for the electronic circuit to be designed. In general, iteration is performed more than once. For that reason, in the present embodiment, Xtalk table 57 is generated at the stage when the design proceeds to postRoute, and the table is used for the subsequent estimation. By doing this, an estimated value with high accuracy can be assigned. The generation of the table is performed by the first generating unit 53c. Since the generation of Xtalk table 57 is performed in such a manner, the Xtalk table prepared in advance is assigned with 57a and the Xtalk table to be newly generated is assigned with 57b in order to distinguish them from each other. As to the layout DB 56, the layout DB before updating is denoted by 56a, and the layout DB after updating is denoted by 56b in order to distinguish before and after.

Figure 12:
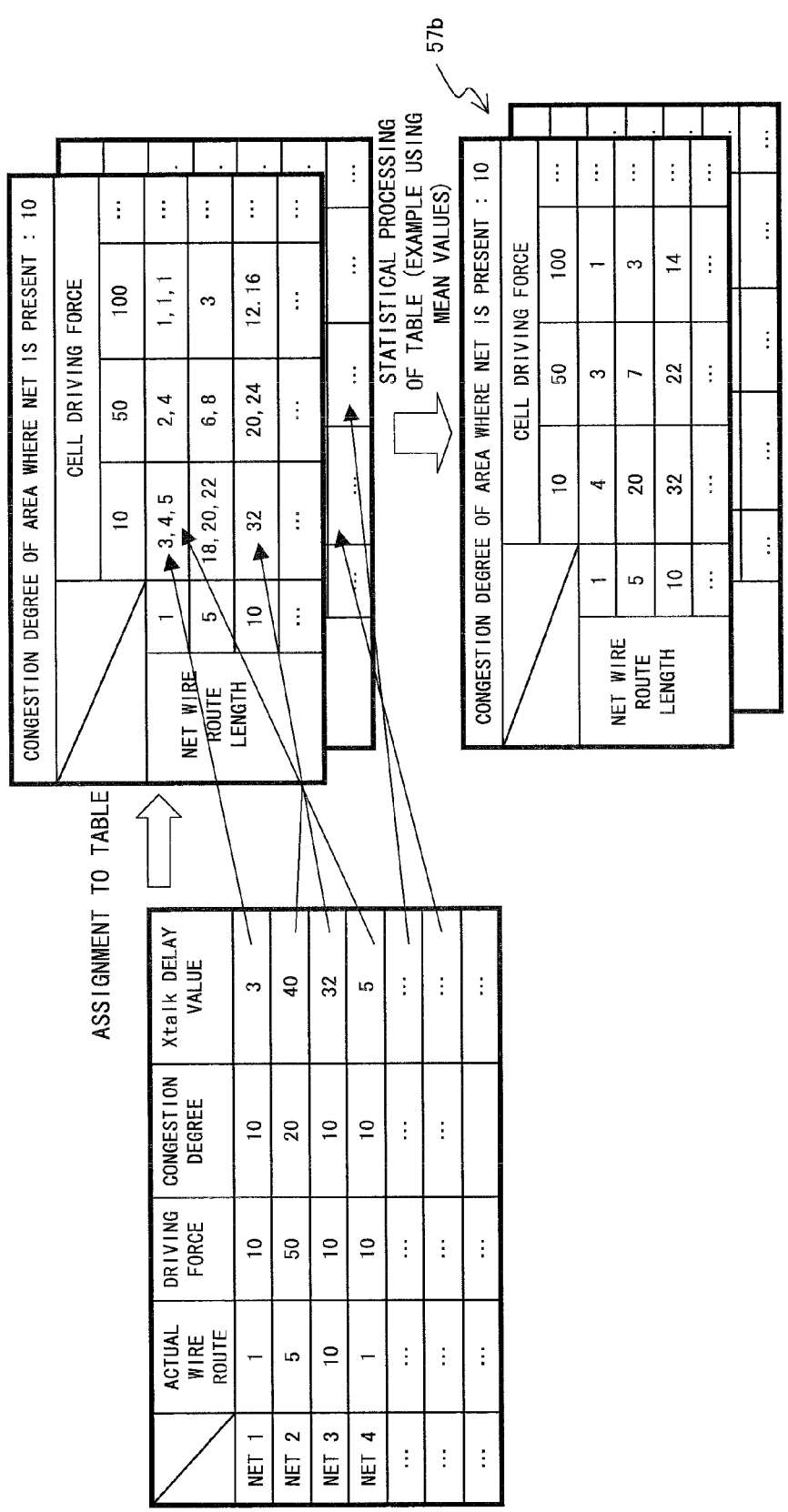
FIG. 12 is a diagram showing a generation method of the Xtalk table.

FIG. 12 is a diagram showing a generation method of Xtalk table 57b.

At the stage where the design proceeds to postRoute, all of the actual wiring line length, the congestion degree, and the Xtalk delay value have been determined for each wiring. The actual wiring line length and the Xtalk delay value are stored in the layout DB 56. Therefore, Xtalk table 57 is generated by compiling the Xtalk delay value for each combination of three indices, and by statistically processing the complied Xtalk delay values, which defines the representative Xtalk delay value. The delay value employed in the statistical processing is the mean value; however, the worst delay value may be employed. Since, in the absence of the combination of three indices, the Xtalk delay value is obtained by interpolation, the delay value defined in Xtalk table 57b is determined so as not to change on an irregular basis.

It should be noted that the present embodiment employs a form of estimation of the Xtalk delay value based on the three indices; however, the indices used for the estimation are not limited to these three. Various modifications are possible. The number of indices may be either more or less than three. For the index, for example, an index evaluating the state of the clock output from the cells connected to the net wiring line may be used instead of the cell driving force.

FIG. 14 is a diagram showing the configuration of the clock table 58.

Figure 2:
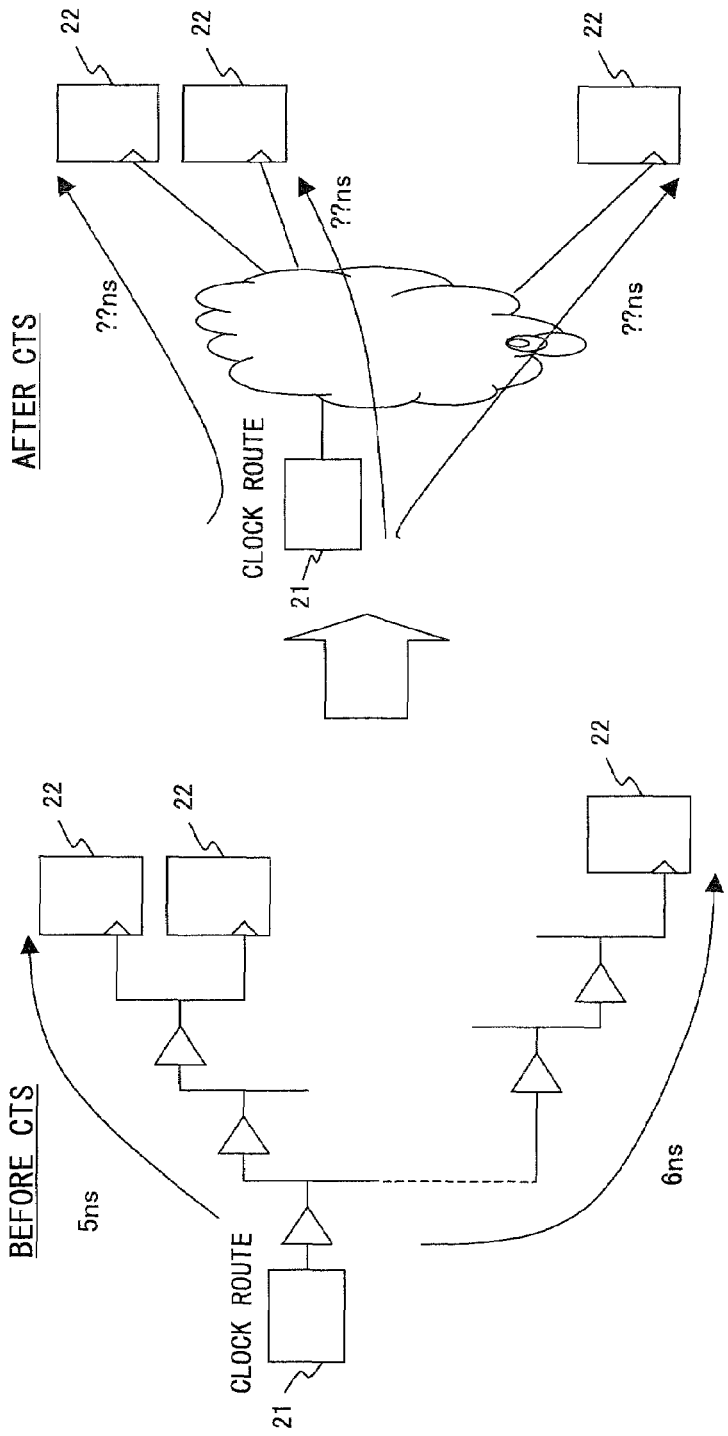
FIG. 2 is a diagram (1) showing the target to be estimated.
Figure 3:
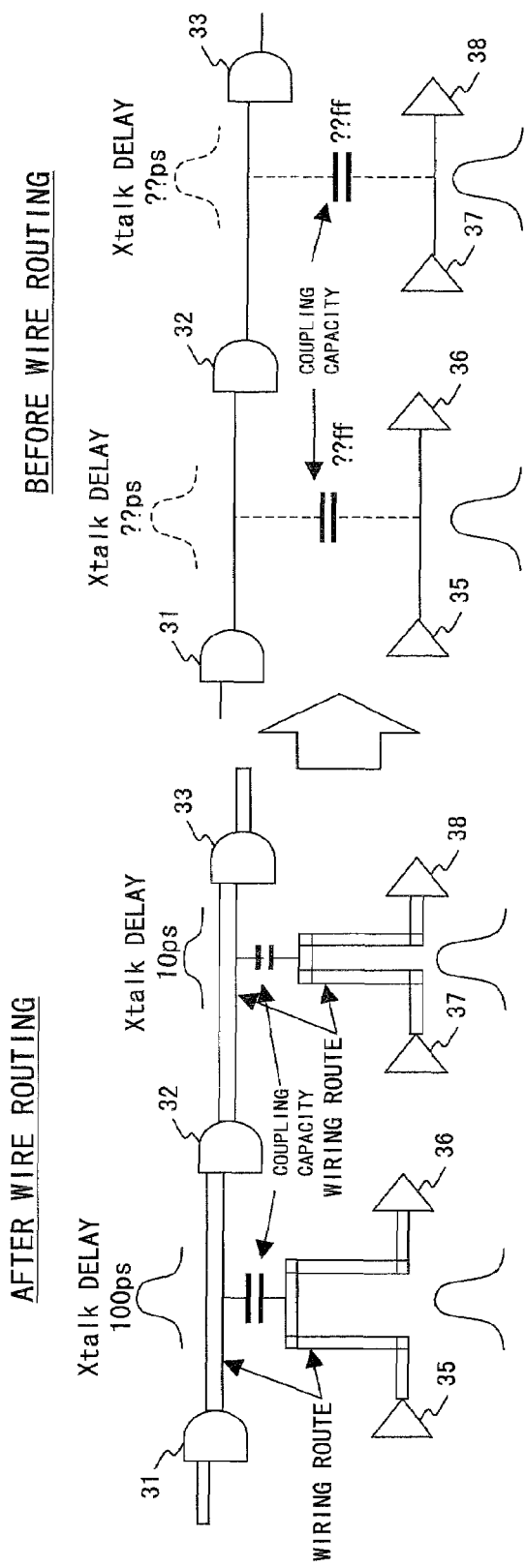
FIG. 3 is a diagram (2) showing the target to be estimated.

The clock delay value required for the clock output from the clock source (driving cell) to reach a cell that will prevent the further propagation of the clock (a synch cell such as a flip-flop (FF)) changes in general depending on the number of cells the clock passes through before reading the synch cell (gating stage number), that is, the number of cells present on the clock route. As shown in FIG. 2, the clock generally reaches the synch cell after repeating branching (and merging). As the number of cells present within a unit area increases, the actual wiring line length becomes long since the wiring has to have a complicated configuration, and the delay value is likely to be large. The clock skew value is likely to be large as the delay value increases. Therefore, the present embodiment employs a three-dimensional table, such as the clock table 58, that defines the clock delay value and the clock skew value for each combination of the maximum gating stage number, the cell (leaf) number, and the size of the area of all the cells together, as shown in FIG. 14. The numerical value placed before "/" is the clock delay value, and the numerical value placed after "/" is the clock skew value. FIG. 14, in the same manner as FIG. 11, represents the table as a set of a plurality of two-dimensional tables separated by the maximum gating number. The cell number is described as the leaf number because cells are indicated as leaves in the clock tree.

In the clock table 58, by defining the clock delay value and the clock skew value for each combination of those indices, those values should be an estimate on the ground of the contents to be considered for estimation of the delay value by a designer with high skills. Hence a designer, regardless of his/her skill level, can quickly assign a reasonable Xtalk delay value at any time. The estimation of those estimated values is automatically performed by a second estimation unit 53*b*.

As shown in FIG. 4, if the design proceeds to postCTS (step S4 of FIG. 1), the clock delay value and the clock skew value are determined for each clock route. Those values do not have a large difference, if the design is the same. Iteration is performed more than once in general. Hence, in the present embodiment, at the stage where the design proceeds to postCTS, a table 59 storing each determined value of the clock delay value and the clock skew value for each clock route is generated (FIG. 10), and those values are used for the subsequent estimation. By doing this, it is possible to assign the estimated value with high accuracy. The generation of the table is performed by a second generating unit 53*d*.

Next, details of the operations of the above automatic estimation unit 53 are explained with reference to the flowcharts in FIGS. 7-10. In the following description, for descriptive purposes, the operations are explained separately by the target tables. All of the flowcharts are realized by the CPU 61 shown in FIG. 6 reading the programs stored in the external storage device 65 to the memory 62 and executing the program.

Figure 7:
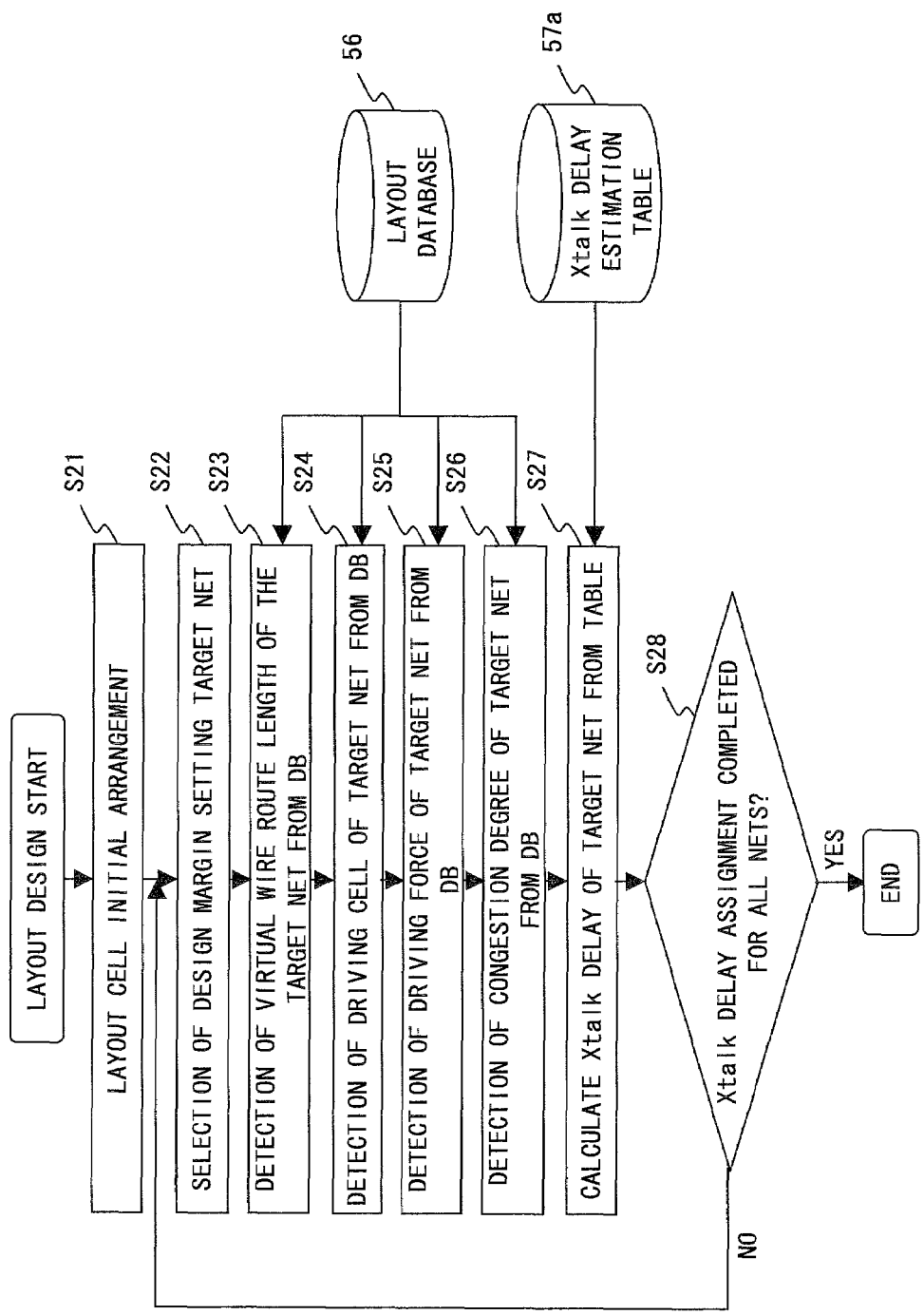
FIG. 7 is a flowchart of the Xtalk delay value estimation processing.

FIG. 7 is a flowchart of the Xtalk delay value estimation processing. The estimation processing is an excerption of a flow of processes executed when the Xtalk delay value is estimated by using either Xtalk table 57*a* or 57*b*. Xtalk table 57*a* is used for the first estimation, and Xtalk table 57*b* is used for the second and succeeding estimations. With reference to FIG. 7, details of the estimation processing are set forth. The estimation processing is performed automatically or under the instruction of a designer after the design phase of step S1 shown in FIG. 1 has ended.

First, in step S21, arrangement information indicating the arrangement of the cell laid out is obtained. In the next step S22, the net wiring line, to which the Xtalk delay value (design margin) is set, is selected. After selection the operation proceeds to step S23. The cell arrangement information and the selection of the net wiring line are performed with reference to the layout DB 56.

In step S23, a virtual wiring line length of the target net wiring line is extracted from the layout DB 56. In the following step S24, with reference to the DB 56, the driving cell of the target net wiring line is detected, and the driving force of the driving cell is detected in the next step S25. In the subsequent step S26, with reference to the DB 56, the congestion degree of the area where the target net wiring line is present is detected (calculated). The operation moves onto step S27 after detecting each value of the three indices in the above manner.

In step S27, using each value of the detected three indices, the Xtalk delay value is calculated with reference to Xtalk table 57*a* (or 57*b*), and the calculated delay value is assigned to the target net wiring line. In step S28, where the operation moves on after the assignment, it is determined whether the assignment of the Xtalk delay value is completed for all setting target net wiring lines or not. If any of the net wiring lines to be assigned with the Xtalk delay value remain, the determination is NO, and the operation returns to step S22 where the setting target is selected from the remaining net wiring lines. Otherwise, if the assignment is completed, the determination is YES, and the processing series is ended at this point in time. Upon the end of processing, the automatic layout processing unit 54 shifts to a state in which the design phase of step S2 shown in FIG. 1 can be performed.

Figure 8:
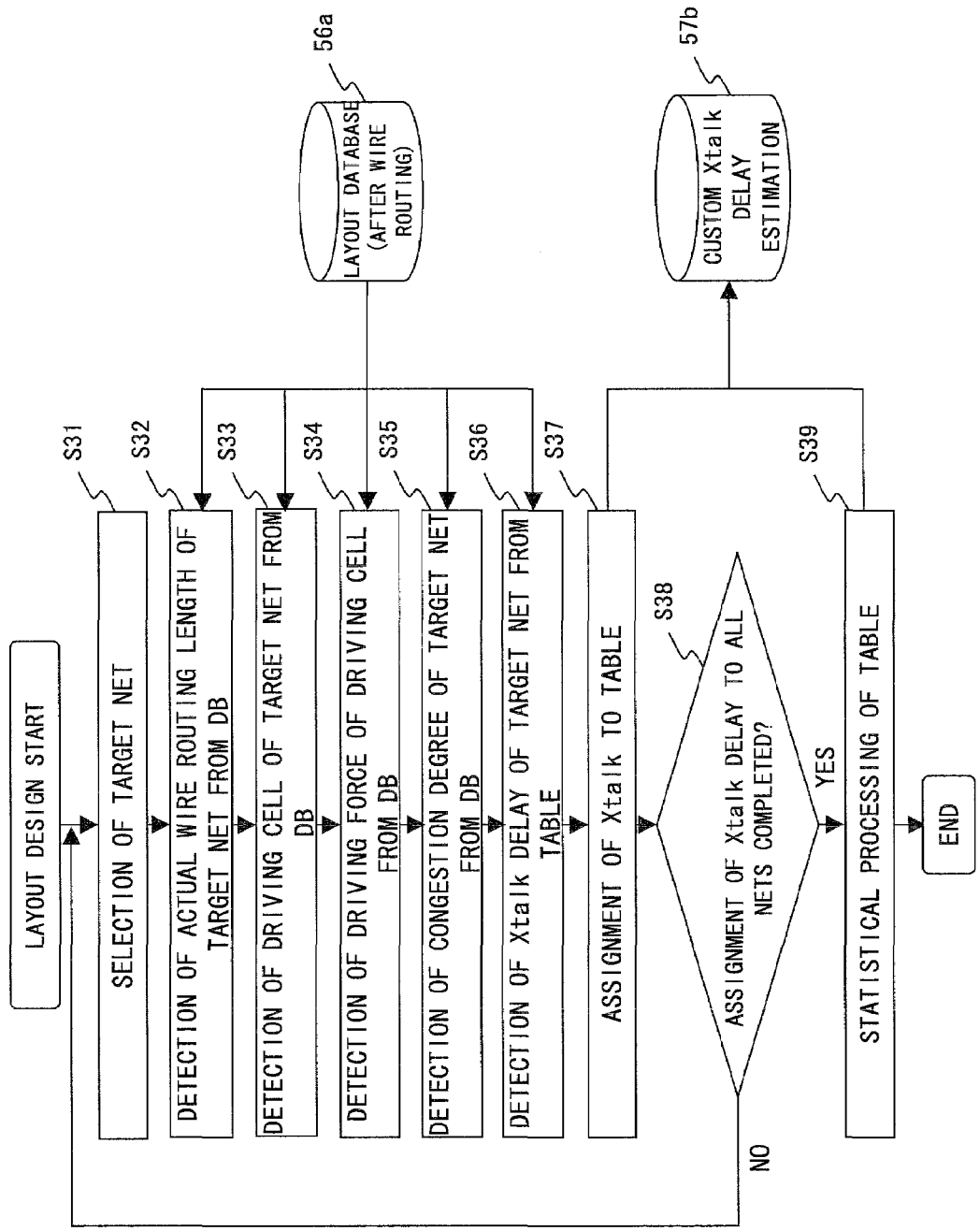
FIG. 8 is a flowchart of the Xtalk table generating processing.

FIG. 8 is a flowchart of the Xtalk table generation processing. Details of the generation processing are set forth next. The generation processing is performed automatically or under instructions from a designer after the end of the design phase of step S6 shown in FIG. 1. Hence, the layout DB 56*b* is referred.

First, in step S31, one of the net wiring lines in which the Xtalk delay value is being determined is selected as a target. In the following step S32, with reference to the layout DB 56*b*, the actual wiring line length of the selected target net wiring line is detected. Afterwards, with reference to the DB 56*b*, the driving cell, its driving force, congestion degree, and the Xtalk delay value are sequentially detected (steps S33-S36). After the detection of those values, the operation moves on to step S37.

In step S37, the detected Xtalk delay value is assigned to a table column specified by each value of the detected three indices. In the following step S38, whether or not the assignment is completed for all net wiring lines is determined. If any of the net wiring lines to be assigned remains, the determination is NO, and the operation returns to step S31 where the target is selected from the remaining net wiring line. Otherwise, if the assignment is completed, the determination is YES, the operation moves on to step S39, and then a processing series is ended after generating Xtalk table 57*b* and storing the Xtalk delay value (FIG. 12) obtained by statistical processing for each table column.

Figure 9:
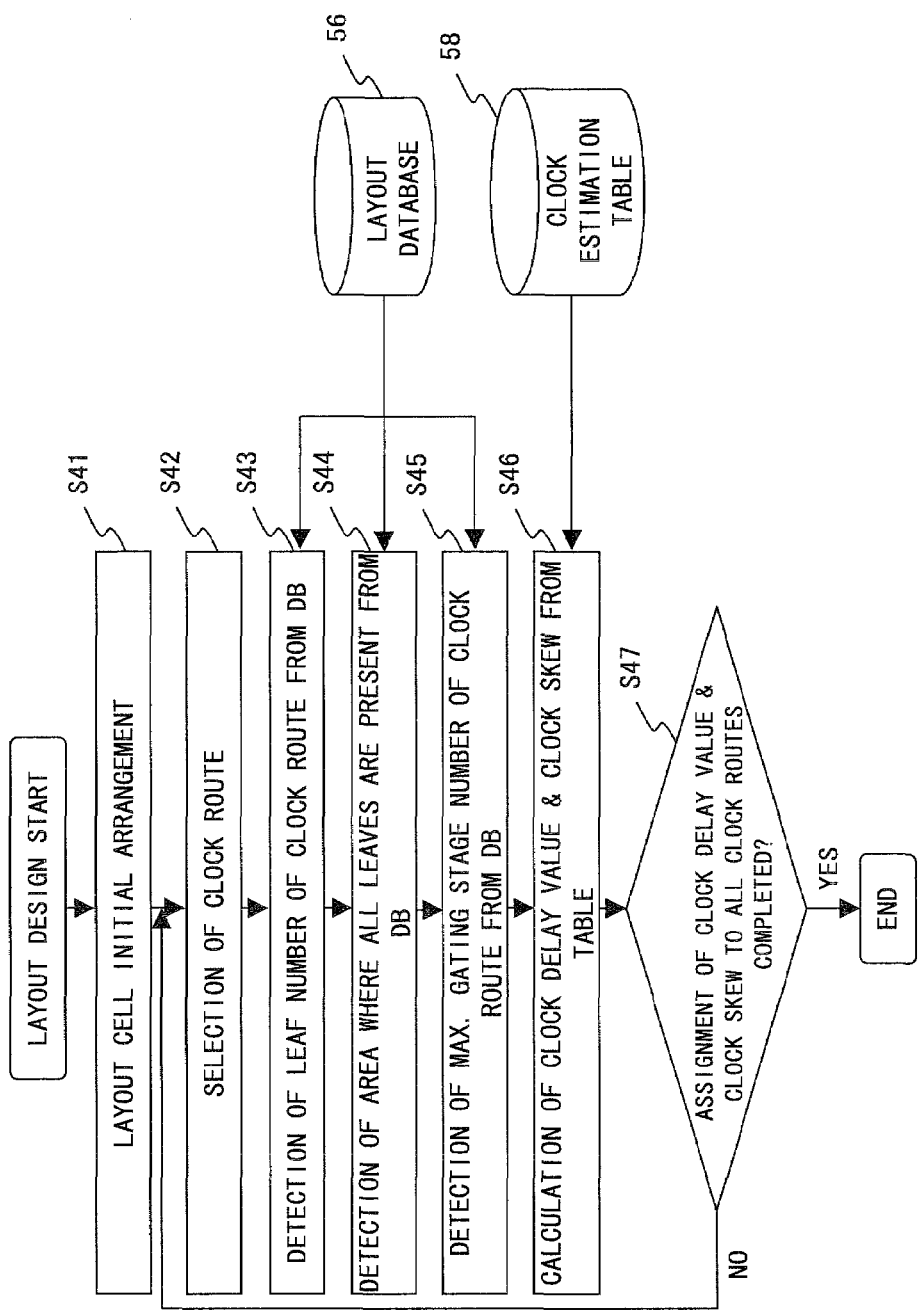
FIG. 9 is a flowchart of the first estimation processing of the clock delay value and the clock skew value.

FIG. 9 is a flowchart of the first estimation processing of the clock delay value and the clock skew value. The estimation processing is an excerption of a flow of a process executed when estimating those estimated values using the clock table 58. Next, with reference to FIG. 9, details of the estimation processing are explained. The estimation processing is performed automatically or under instructions from a designer after the end of the design phase of step S1 shown in FIG. 1.

First, in step S41, arrangement information indicating the arrangement of the cell that has been laid out is obtained. In the next step S42, the clock route to which the clock delay value and the clock skew value are assigned is selected. After the selection the operation proceeds to step S43. The cell arrangement information and the clock route selection are performed with reference to the layout DB 56. The clock route selection here corresponds to the selection of the driving cell.

In step S43, the cell (leaf) number of the clock route is detected from the layout DB 56. In the following step S44, with reference to the DB 56, the size of the area where all cells are present is detected. In the subsequent step S45, the maximum gating stage number on the clock route is detected. The operation moves on to step S46 after detecting each value of the three indices in the above manner.

In step S46, using each value of the detected three indices, the clock delay value and the clock skew value are calculated with reference to the clock table 58, and those calculated values are assigned to the clock route. In step S47, where the operation proceeds after the assignment, it is determined whether or not the assignment of the clock delay value and the clock skew value are completed for all clock routes to be setting. If any of the clock routs to be assigned with those estimate values remains, the determination is NO, and the operation returns to step S42 where the setting target is selected from the remaining clock routes. Otherwise, if the assignment is completed, the determination is YES, and the processing series is ended at this point in time. Upon the end of processing, the automatic layout processing unit 54 shifts to a state in which the design phase of step S2 shown in FIG. 1 can be performed.

Figure 10:
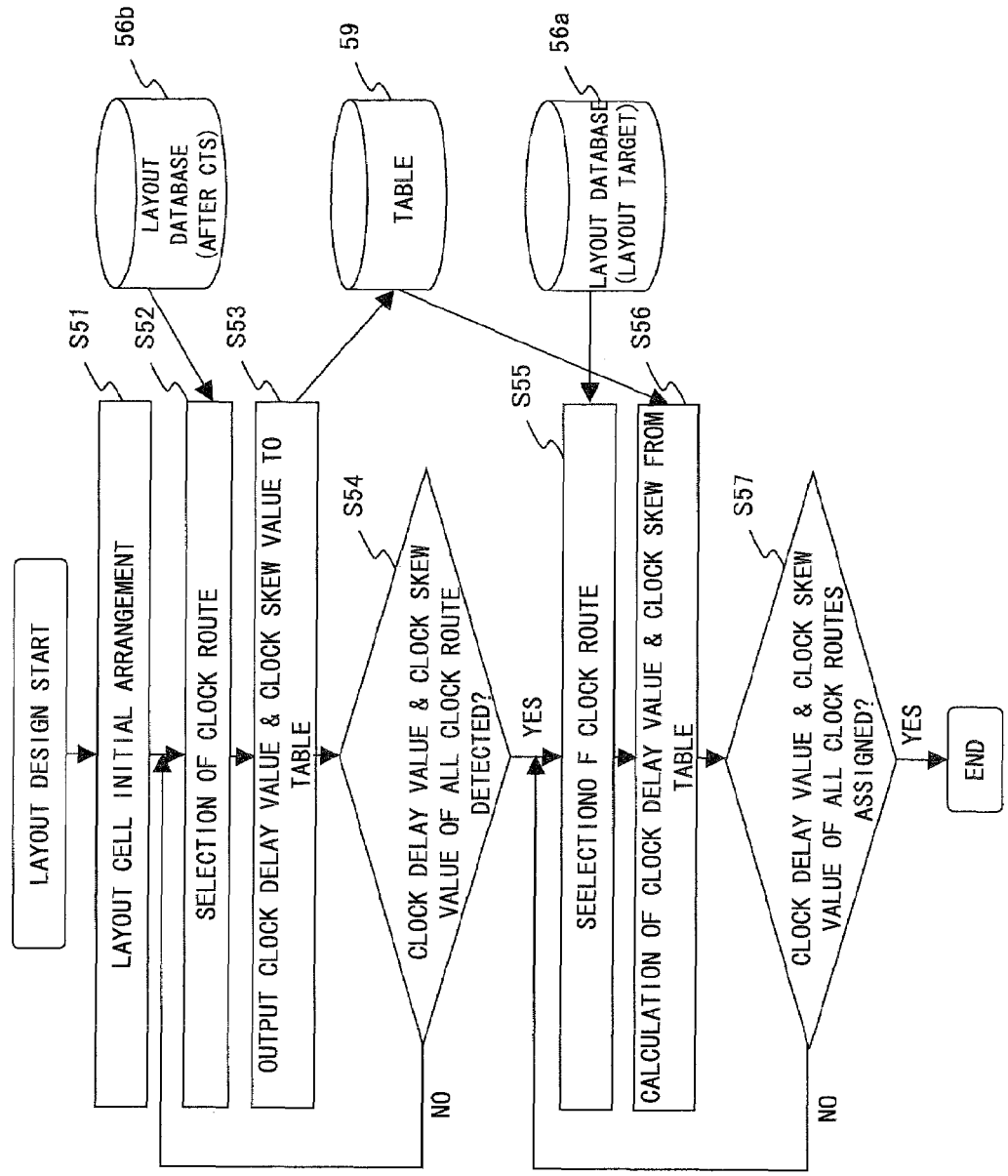
FIG. 10 is a flowchart of the second estimation processing of the clock delay value and the clock skew value.

FIG. 10 is a flowchart of the second estimation processing of the clock delay value and the clock skew value. The estimation processing is an excerption of a flow of a process executed when estimating those estimated values at the second iteration or succeeding iterations. Finally, with reference to FIG. 10, details of the estimation processing are explained. The estimation processing is performed automatically or under instructions from a designer after the end of the design phase of step Si shown in FIG. 1.

First, in step S51, arrangement information indicating the arrangement of the cell being laid out is obtained. In the next step S52, the clock route from which the clock delay value and the clock skew value are extracted is selected from the layout DB 56, and those values are extracted. In the next step S53, the extracted clock delay value and the clock skew value are stored in table 59 after corresponding to the clock route. After the storage, the operation moves on to step S54, and determines whether or not the clock delay value and the clock skew value have been detected from every clock route. If any of the clock routes from which those values must be detected remains, the determination is NO, and the operation returns to step S52 where the target is selected from the remaining clock routes. Otherwise, if the generation of the table 59 is completed, the determination is YES, and the operation moves on to step S55.

In step S55, with reference to the layout DB 56a, a clock route to which the clock delay value and the clock skew value are assigned is selected. In the following step S56, the clock delay value and the clock skew value of the selected clock route are extracted (calculated) from table 59, and those values are assigned. After the assignment, the operation moves onto step S57 and determines whether or not the clock delay value and the clock skew value have been assigned to every clock route that will be a setting target. If any of the clock routes to which those estimated values are to be assigned remains, the determination is NO, and the operation returns to step S55 where the setting target is selected from the remaining clock routes. Otherwise, if the assignment is completed, the determination is YES, and the processing series is ended at this point in time. Upon the end of processing, the automatic layout processing unit 54 shifts once again to a state in which the design phase of step S2 shown in FIG. 1 can be performed.

It should be noted that the present embodiment automatically performs assignment of the Xtalk delay value, and assignment of the clock delay value and the clock skew value, and then shifts the state to a state in which automatic layout processing is performed; however, the operations are not necessarily carried out in such a manner. A designer may arbitrarily change the automatically assigned estimated values. The change may be made in accordance with instructions from the designer via the input processing unit 51 by, for example, displaying the assigned estimated values on a display device via the display control unit 52. The designer may arbitrarily select whether or not to confirm that such a change can be made.

What is claimed is:

1. An automatic estimation method for automatically estimating a crosstalk delay value to be assigned for automatic layout processing to determine arrangement of cells constituting a logic-designed electronic circuit and a wiring line connected between the cells, the method comprising:
preparing, in advance, an initial table defining a plurality of crosstalk delay values;
preparing one or more reference values for reference to the initial crosstalk delay values defined in the table by obtaining data for the automatic layout processing; and
estimating automatically an estimated value based upon the reference values and the initial crosstalk values from the initial table for each combination of a plurality of indices indicating a degree of influence of crosstalk noise occurring in a wiring line connected between the cells.

2. The automatic estimation method according to claim 1, wherein
one or more of a length of the wire line, driving force of a cell generating a signal traveling the wire line, and a congestion degree indicating a degree of wiring in an area where the wire line is present, are employed as the plurality of indices.

3. The automatic estimation method according to claim 1, wherein
if a determined value corresponding to the estimated value is obtained by execution of the automatic layout processing, a table defining any of the determined values and any values obtained from the determined values is newly prepared as the table.

4. An automatic estimation method for automatically estimating an estimated value to be assigned for automatic layout processing to determine arrangement of cells constituting a logic-designed electronic circuit and a wiring line connected between the cells, comprising:
preparing in advance, a table defining a plurality of the estimated values;
preparing one or more reference values for reference to the estimated value defined in the table by obtaining data for the automatic layout processing; and
estimating automatically an estimated value, by extracting estimated value specified from prepared reference value from the table wherein,
the estimated value is a clock skew value and a table having as an index one or more of maximum number of cells present on a clock route that goes from a cell generating and outputting a clock to a cell that the clock reaches in the end, a total number of cells present on the clock route, and a size of an area where all cells are present, is prepared as the table.

5. The automatic estimation method according to claim 4, wherein
if a determined value corresponding to the estimated value is obtained by execution of the automatic layout processing, a table defining any of the determined values and any values obtained from the determined values is newly prepared as the table.

6. An automatic estimation method for automatically estimating an estimated value to be assigned for automatic layout processing to determine arrangement of cells constituting a logic-designed electronic circuit and wiring line connected between the cells, comprising:
obtaining data for the automatic layout processing;
preparing a plurality of values used for estimation of the estimated value from the obtained data; and
automatically estimating the estimated value using prepared plurality of values, wherein
the estimated value is a crosstalk delay value and a table defining the estimated value for each combination of a plurality of indices indicating a degree of influence of crosstalk noise occurring in wiring line connected between the cells is prepared as the table.

7. An automatic estimation apparatus for automatically estimating an estimated value to be assigned for automatic layout processing to determine arrangement of cells constituting a logic-designed electronic circuit and a wiring line connected between the cells, comprising:

a table obtaining unit to obtain a table that defines a plurality of the estimated values;

a data obtaining unit to obtain data for the automatic layout processing; and an estimation unit to prepare one or more of reference value for reference of the estimated value defined in the table from the data obtained by the data obtaining unit, extract an estimated value specified from the prepared reference value from the table, and automatically perform estimation, wherein the estimated value is a crosstalk delay value and the table obtaining unit prepares as the table a table defining the estimated value for each combination of a plurality of indices indicating a degree of influence of crosstalk noise occurring in a wiring line connected between the cells.

8. The automatic estimation apparatus according to claim 7, wherein one or more of a length of the wiring line, driving force of a cell generating a signal traveling the wiring line, and a congestion degree indicating a degree of wiring in an area where the wiring line is present, are employed as the plurality of indices.

9. The automatic estimation apparatus according to claim 7, wherein if a determined value corresponding to the estimated value is obtained by execution of the automatic layout processing, the table obtaining unit newly prepares as the table, a table defining any of the determined value and a value obtained from the determined value.

10. An automatic estimation apparatus for automatically estimating an estimated value to be assigned for automatic layout processing to determine arrangement of cells constituting a logic-designed electronic circuit and a wiring line connected between the cells, comprising:

a table obtaining unit to obtain a table that defines a plurality of the estimated values;

a data obtaining unit to obtain data for the automatic layout processing; and an estimation unit to prepare one or more of reference value for reference of the estimated value defined in the table from the data obtained by the data obtaining unit, extract an estimated value specified from the prepared reference value from the table, and automatically perform estimation, wherein the estimated value is a clock skew value, an the table unit prepares as the table a table having as an index one or more of a maximum cell number present on a clock route from a cell generating and outputting a clock and a cell that the clock reaches in the end, a total cell number present on the clock route, and a size of an area where all cell is present.

11. The automatic estimation apparatus according to claim 10, wherein if a determined value corresponding to the estimated value is obtained by execution of the automatic layout processing, the table obtaining unit newly prepares as the table, a table defining any of the determined value and a value obtained from the determined value.

12. A recording medium being readable by a computer which can be used as an automatic estimation apparatus that automatically estimating an estimated value to be assigned for automatic layout processing determining arrangement of cells constituting a logic-designed electronic circuit, a wiring line connected between the cells, and a recording program for realizing:

a table obtaining function for obtaining a table defining a plurality of the estimated values;

a data obtaining function for obtaining data for the automatic layout processing; and an estimation function for preparing one or more of a reference value for reference of the estimated value defined in the table from the data obtained in the data obtaining function, extracting an estimated value specified from the prepared reference value form the table, and automatically performing estimation, wherein the estimated value is a crosstalk delay value and the table obtaining unit prepares as the table a table defining the estimated value for each combination of a plurality of indices indicating a degree of influence of crosstalk noise occurring in a wiring line connected between the cells.

13. The recording medium being readable by a computer according to claim 12, wherein the table obtaining function that, if a determined value corresponding to the estimated value is obtained by execution of the automatic layout processing, newly prepares as the table a table defining any of the determined values and any values obtained from the determined values.

* * * * *